(12) United States Patent
Ono et al.

(10) Patent No.: US 7,338,576 B2
(45) Date of Patent: Mar. 4, 2008

(54) PLASMA PROCESSING DEVICE

(75) Inventors: Hiroo Ono, Yamanashi (JP); Koichi Tateshita, Yamanashi (JP); Masanobu Honda, Yamanashi (JP); Kazuya Nagaseki, Yamanashi (JP); Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 10/490,027

(22) PCT Filed: Sep. 19, 2002

(86) PCT No.: PCT/JP02/09588

§ 371 (c)(1),
(2), (4) Date: Mar. 19, 2004

(87) PCT Pub. No.: WO03/028078

PCT Pub. Date: Apr. 3, 2003

(65) Prior Publication Data

US 2004/0238125 A1    Dec. 2, 2004

(30) Foreign Application Priority Data

Sep. 20, 2001  (JP) ............................. 2001-287539

(51) Int. Cl.
*H01L 21/00* (2006.01)
(52) U.S. Cl. .............................................. 156/345.46
(58) Field of Classification Search ........ 118/723 MA; 156/345.46, 345.42, 345.49
See application file for complete search history.

(56) References Cited

U.S. PATENT DOCUMENTS

| | | | | |
|---|---|---|---|---|
| 4,894,510 A | * | 1/1990 | Nakanishi et al. | 219/121.43 |
| 5,413,663 A | | 5/1995 | Shimizu et al. | |
| 5,444,207 A | * | 8/1995 | Sekine et al. | 219/121.43 |
| 6,014,943 A | * | 1/2000 | Arami et al. | 118/723 E |
| 6,063,236 A | | 5/2000 | Sakai | |
| 6,196,155 B1 | * | 3/2001 | Setoyama et al. | 118/723 MA |
| 6,383,565 B1 | * | 5/2002 | Monaghan | 427/248.1 |
| 2005/0211383 A1 | * | 9/2005 | Miyata et al. | 156/345.46 |

FOREIGN PATENT DOCUMENTS

| | | | |
|---|---|---|---|
| JP | 04280430 A | * | 10/1992 |
| JP | 5-226303 | | 9/1993 |
| JP | 06181187 A | * | 6/1994 |
| JP | 07102378 A | * | 4/1995 |
| JP | 2000-173800 | | 6/2000 |
| JP | 2000-306845 | | 11/2000 |
| JP | 2001-77095 | | 3/2001 |

* cited by examiner

*Primary Examiner*—Parviz Hassanzadeh
*Assistant Examiner*—Michelle Crowell
(74) *Attorney, Agent, or Firm*—Oblon, Spivak, McClelland, Maier & Neustadt, P.C.

(57) ABSTRACT

Each magnet segment 22 of a magnetic field forming mechanism 21 is constructed such that, after the magnetic pole of each magnet segment 22 set to face a vacuum chamber 1 as shown in FIG. 3A, adjoining magnet segments 22 are synchronously rotated in opposite directions, and hence every other magnet element 22 is rotated in the same direction as shown in FIGS. 3B, 3C to thereby control the status of a multi-pole magnetic field formed in the vacuum chamber 1 and surrounding a semiconductor wafer W. Therefore, the status of a multi-pole magnetic field can be easily controlled and set appropriately according to a type of plasma processing process to provide a good processing easily.

12 Claims, 13 Drawing Sheets

DISTANCE FROM CENTER OF SEMICONDUCTOR WAFER (mm)

PLASMA PROCESSING DEVICE

FIELD OF THE INVENTION

The present invention relates to a plasma processing device; and, more particularly, to a plasma processing device for performing a plasma processing such as etching on a substrate to be processed, e.g., a semiconductor wafer.

BACKGROUND OF THE INVENTION

In a field of manufacturing semiconductor devices, a plasma processing device has been used to perform a predetermined processing (e.g., etching or film formation) on a substrate to be processed (e.g., a semiconductor wafer) accommodated in a processing chamber by applying a plasma generated in the processing chamber thereto.

In such a plasma processing device, a state of the plasma needs to be kept suitable for the plasma processing in order to perform a good processing. For such reason, conventionally there are numerous plasma processing devices incorporating therein a magnetic field forming mechanism which forms a magnetic field for controlling the plasma.

There are known a dipole type and a multi-pole type for such magnetic field forming mechanism. The dipole type mechanism forms a dipole magnetic field in a predetermined direction above a horizontally disposed substrate to be processed such as a semiconductor wafer or the like having a to-be-processed surface facing upward. The multi-pole type mechanism, which includes a plurality of N and S magnetic poles alternately disposed around a horizontally disposed substrate to be processed such as a semiconductor wafer or the like having a to-be-processed surface facing upward, forms a multi-pole magnetic field to surround the periphery of the semiconductor wafer, while avoiding formation of the multi-pole magnetic field thereabove.

As described above, there have been plasma processing devices known to form a predetermined multi-pole magnetic field around the periphery of a substrate to be processed such as a semiconductor wafer in a processing chamber; to control a state of a plasma by the multi-pole magnetic field; and to carry out a plasma process such as etching or the like.

According to the findings of the inventors of the present invention, it is shown that there are two kinds of processes in a plasma process (e.g., a plasma etching) as described below.

A first kind of process in which the plasma etching process is performed while the multi-pole magnetic field is formed as mentioned above, improves an in-surface uniformity of the etching rate. Contrary to the first kind of process, a second kind of process which also improves the in-surface uniformity of the etching rate performs plasma etching process in the absence of the multi-pole magnetic field.

For instance, in an etching process of a silicon oxide film or the like, the in-surface uniformity of the etching rate (etching velocity) can be improved when etched in the presence of the multi-pole magnetic field in comparison with a case of performing etching in the absence of the multi-pole magnetic field. In case of performing etching in this process without the multi-pole magnetic field, there is a non-uniformity of the etching rate, i.e., the etching rate is increased in a center region of the semiconductor wafer and decreased in a periphery portion thereof.

On the other hand, in an etching process of an organic-based low dielectric film (so-called Low-K) or the like, the in-surface uniformity of the etching rate can be improved when etched in the absence of the multi-pole magnetic field in comparison with a case of performing etching in the presence of the multi-pole magnetic field. In particular, when etched in the presence of the multi-pole magnetic field in such a process, the etching rate is decreased in a center region of the semiconductor wafer and increased in a periphery portion thereof.

Employing electromagnets in the aforementioned magnetic field forming mechanism facilitates formation and removal of the magnetic field. However, doing so increases power consumption and for such reason, permanent magnets are employed instead of the electromagnets in most devices.

However, in case of employing the permanent magnets, additional steps of attaching and detaching the magnetic field forming mechanism are required for formation and removal of the magnet field, which hinders facilitation of such processes.

SUMMARY OF THE INVENTION

It is, therefore, an object of the present invention to provide a plasma processing device capable of easily setting and controlling states of a multi-pole magnetic field according to the kinds of processing processes to be performed, thereby easily performing a proper process.

In accordance with the preferred embodiment of the present invention, there is provided a plasma processing device including: a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber, wherein strength of the multi-pole magnetic field formed around the substrate to be processed in the processing chamber is adjusted according to a type of to-be-etched layer formed on the substrate to be processed by changing relative positions of the magnet segments.

In accordance with another preferred embodiment of the present invention, there is provided a plasma processing device including: a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber, wherein at least parts of the magnet segments are rotated about respective vertical axes thereof to change magnetic pole directions thereof, thereby controlling strength of the multi-pole magnetic field formed around the substrate to be processed.

In the present invention, the magnetic field forming mechanism may rotate two neighboring magnet segments in opposite directions; the magnetic field forming mechanism may rotate the magnet segments in a same direction; and only every other magnet segments may be rotated in a direction. Further, a magnetic pole of the multi-pole magnetic field may be formed by a magnet segment set formed of a plural number of neighboring magnet segments, which are synchronously rotated in a same direction. Further, presence and absence of the multi-pole magnetic field formed around the substrate to be processed accommodated in the processing chamber may be set by rotating the magnet segments.

In accordance with still another preferred embodiment of the present invention, there is provided a plasma processing device including: a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber, wherein the magnetic field forming mechanism is separated into an upper magnetic field forming mechanism and a lower magnet field forming mechanism installed therebelow, and the upper and the lower magnetic field forming mechanism are moved vertically to move to and apart from each other, thereby controlling strength of the multi-pole magnetic field formed around the substrate to be processed in the processing chamber according to a type of to-be-etched layer formed on the substrate to be processed.

In accordance with still another preferred embodiment of the present invention, there is provided a plasma processing device including: a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber, wherein the magnetic field forming mechanism is separated into an upper and a lower magnetic field forming mechanism installed above and below thereof, respectively; and the plurality of magnet segments respectively installed in the upper and the lower magnetic field forming mechanism are rotated about respective horizontal axes thereof, the plurality of magnet segments being set to be erect or be tilted, thereby controlling strength of the multi-pole magnetic field formed around the substrate to be processed in the processing chamber according to a type of to-be-etched layer formed on the substrate to be processed.

In accordance with still another preferred embodiment of the present invention, there is provided a plasma processing device including: a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber, wherein the magnet segments are allowed to be moved to and apart from the processing chamber, thereby controlling strength of the multi-pole magnetic field formed around the substrate to be processed in the processing chamber according to a type of to-be-etched layer formed on the substrate to be processed.

In the preferred embodiments of the present invention, the magnet segments have a substantially cylindrical shape.

In the present invention, a silicon oxide film formed on the substrate to be processed may be etched in the presence of the multi-pole magnetic field; and an organic-based low dielectric film formed on the substrate to be processed may be etched in the absence of the multi-pole magnetic field.

In the preferred embodiment of the present invention, there is provided a plasma processing device having a processing chamber accommodating therein a substrate to be processed; a plasma generating mechanism installed in the processing chamber for performing a plasma process on the substrate to be processed; and a magnetic field forming mechanism for forming a multi-pole magnetic field around the substrate to be processed accommodated in the processing chamber, the magnetic field forming mechanism being constructed by arranging a plurality of magnet segments made of a permanent magnets and being installed outside the processing chamber; and wherein the plasma processing device comprises a control mechanism for controlling strength of the multi-pole magnetic field formed around the substrate to be processed in the processing chamber according to a type of to-be-etched layer formed on the substrate to be processed, the control mechanism allows etching of a silicon oxide film to be carried out in the presence of the multi-pole magnetic field and an etching of an organic-based low dielectric layer to be carried out in the absence of the multi-pole magnetic field.

DETAILED DESCRIPTION OF THE PREFERRED EMBODIMENT

Preferred embodiments of the present invention will be described in detail with reference to the accompanying drawings.

Figure 1:
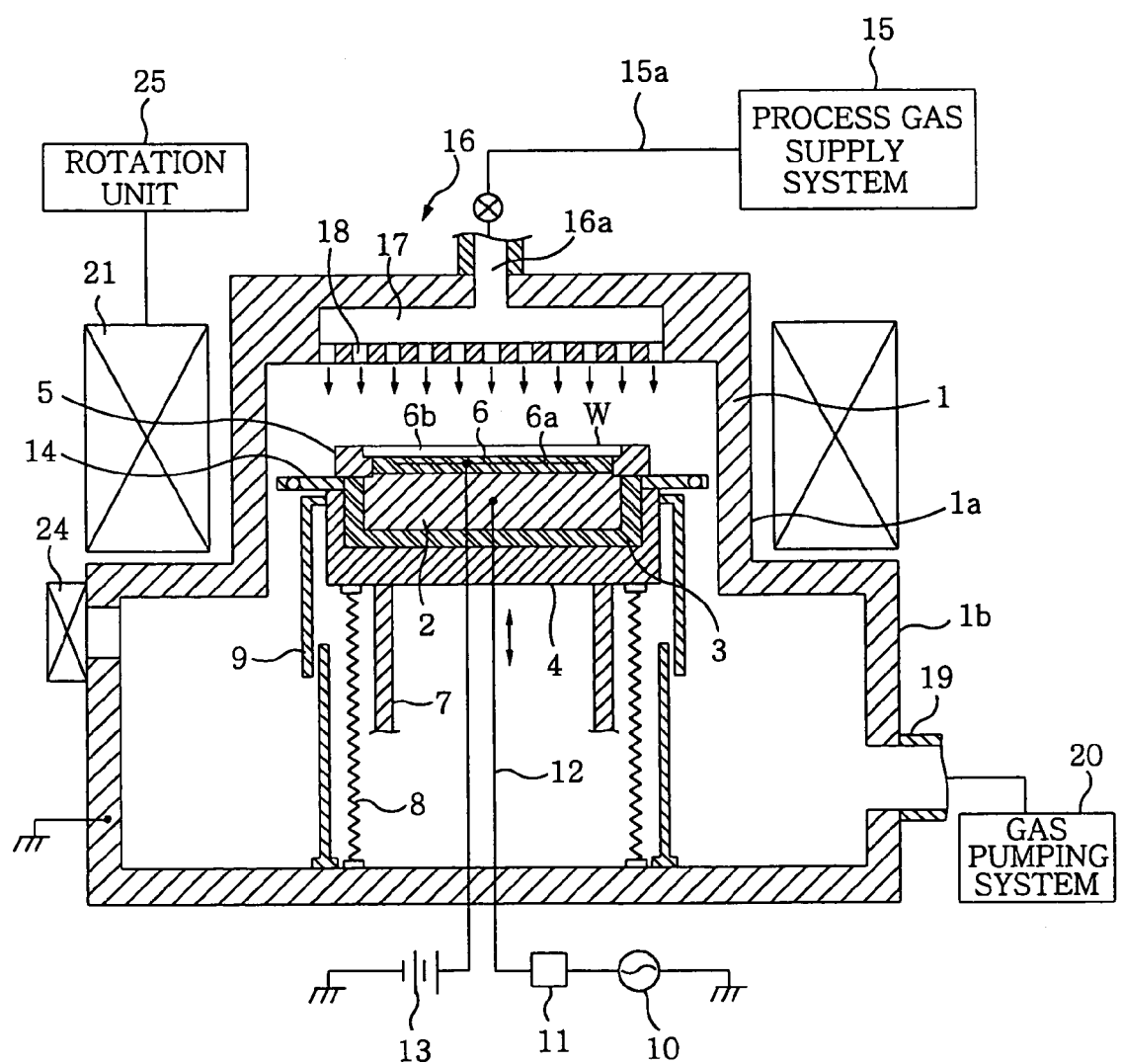
FIG. 1 offers a schematic diagram of a plasma processing device in accordance with a preferred embodiment of the present invention.

FIG. 1 is a schematic diagram illustrating a configuration of a plasma processing device for etching a semiconductor wafer in accordance with a preferred embodiment of the present invention. A reference numeral 1 in FIG. 1 represents a vacuum chamber made of, e.g., aluminum, and configured to air-tightly seal an inner space thereof. The vacuum chamber 1 has a cylindrical shape and the inner space thereof is used as a plasma processing chamber.

The vacuum chamber 1 has a stepped cylindrical shape with an upper portion 1a having a smaller diameter and a lower portion 1b having a larger diameter and is connected to a ground potential. Further, installed in the vacuum chamber 1 is a supporting table (a susceptor) 2 for substantially horizontally supporting a semiconductor wafer W serving as a substrate to be processed having a to-be-processed surface thereof facing upward.

The supporting table 2 is made of, e.g., aluminum, and is supported at a conductive support 4 via an insulating plate made of, e.g., a ceramic. Further, installed on an upper periphery portion of the supporting table 2 is a focus ring 5 made of a conductive material or an insulating material.

Provided on a mounting surface of the supporting table 2 is an electrostatic chuck 6 for electrostatically adsorbing the semiconductor wafer W. The electrostatic chuck 6 has therein an electrode 6a embedded in an insulator 6b and the electrode 6a is connected to a DC power supply 13. By applying voltage from the DC power supply 13 to the electrode 6a, the semiconductor wafer W is adsorbed by the electrostatic chuck 6 by, e.g., the Coulomb force.

Also, provided in the supporting table 2 are a coolant path (not shown) for circulating a coolant; a gas introduction mechanism (not shown) for supplying a He gas to a backside of the semiconductor wafer W in order to efficiently transfer cold heat from the coolant to the semiconductor wafer W. The semiconductor wafer W can be controlled at a desired temperature by the coolant path and the gas introduction mechanism.

The supporting table 2 and the support 4 are elevated upward and downward by a ball screw mechanism including a ball screw 7. A driving portion below the support 4 is covered with a bellows 8 made of a stainless steel (SUS) and a bellows cover 9 is provided outside the bellows 8.

Further, connected approximately at a center portion of the supporting table 2 is a feeder line 12 for supplying a high frequency power. A matching box 11 and a high frequency power supply 10 are connected to the feeder line 12. The high frequency power supply 10 supplies a high frequency power having a frequency of, e.g., 100 MHz, to the supporting table 2, wherein the high frequency power may range from 13.56 to 150 MHz, preferably from 13.56 to 100 MHz. Also, from a viewpoint of increasing an etching rate, it is preferable to superpose the high frequency for generating the plasma and for inducing and implanting the ions in the plasma. The high frequency power supply (not shown) for ion induction/implantation (i.e., for controlling a bias voltage) has a high frequency ranging from 500 KHz to 13.56 MHz. The high frequency is preferably set to be 3.2 MHz in case of etching a silicon oxide film and 13.56 MHz in case of etching a polysilicon film or an organic material film.

Furthermore, installed outside the focus ring 5 is a baffle plate 14 electrically connected to the vacuum chamber 1 via the support 4 and the bellows 8.

Meanwhile, installed at a ceiling of the vacuum chamber 1 is a shower head 16 facing the supporting table 2 in parallel, wherein the shower head 16 is grounded. Accordingly, the supporting table 2 and the shower head 16 serve as a pair of electrodes. The shower head 16 has a multiplicity of gas inlet holes 18 at a lower surface thereof and a gas inlet 16a at an upper portion thereof. A gas diffusion space 17 is provided within the shower head 16. A gas supply line 15a is connected to the gas inlet 16a and a process gas supply system 15 for supplying a process gas (a reaction gas for etching and a dilution gas) is connected to another end of the gas supply line 15a.

A halogen-based gas or the like may be used as the reaction gas, whereas, e.g., an Ar gas, an He gas or the like can be used as the dilution gas, as conventionally used in the art. The process gas is supplied from the process gas supply system 15 to the gas diffusion space 17 of the shower head 16 via the gas supply line 15a and the gas inlet 16a, and then injected from the gas inlet holes 18. The process gas is used to etch a film formed on the semiconductor wafer W.

Formed at a sidewall of the lower part 1b of the vacuum chamber 1 is a gas outlet port 19 connected to a gas pumping system 20. By operating a vacuum pump incorporated in the gas pumping system 20, the vacuum chamber 1 can be depressurized to a predetermined vacuum level. Installed at an upper portion of the sidewall of the lower portion 1b of the vacuum chamber 1 is a gate valve 24 for opening and closing a loading/unloading port for the semiconductor wafer W.

Concentrically disposed around the periphery of the upper portion 1a of the vacuum chamber 1 is an annular magnetic field forming mechanism (a ring magnet) 21 for forming a magnetic field around a processing space between the supporting table 2 and the shower head 16. This magnetic field forming mechanism 21 is rotated around the vacuum chamber 1 at a predetermined rotataion speed by a rotation unit 25.

Figure 2:
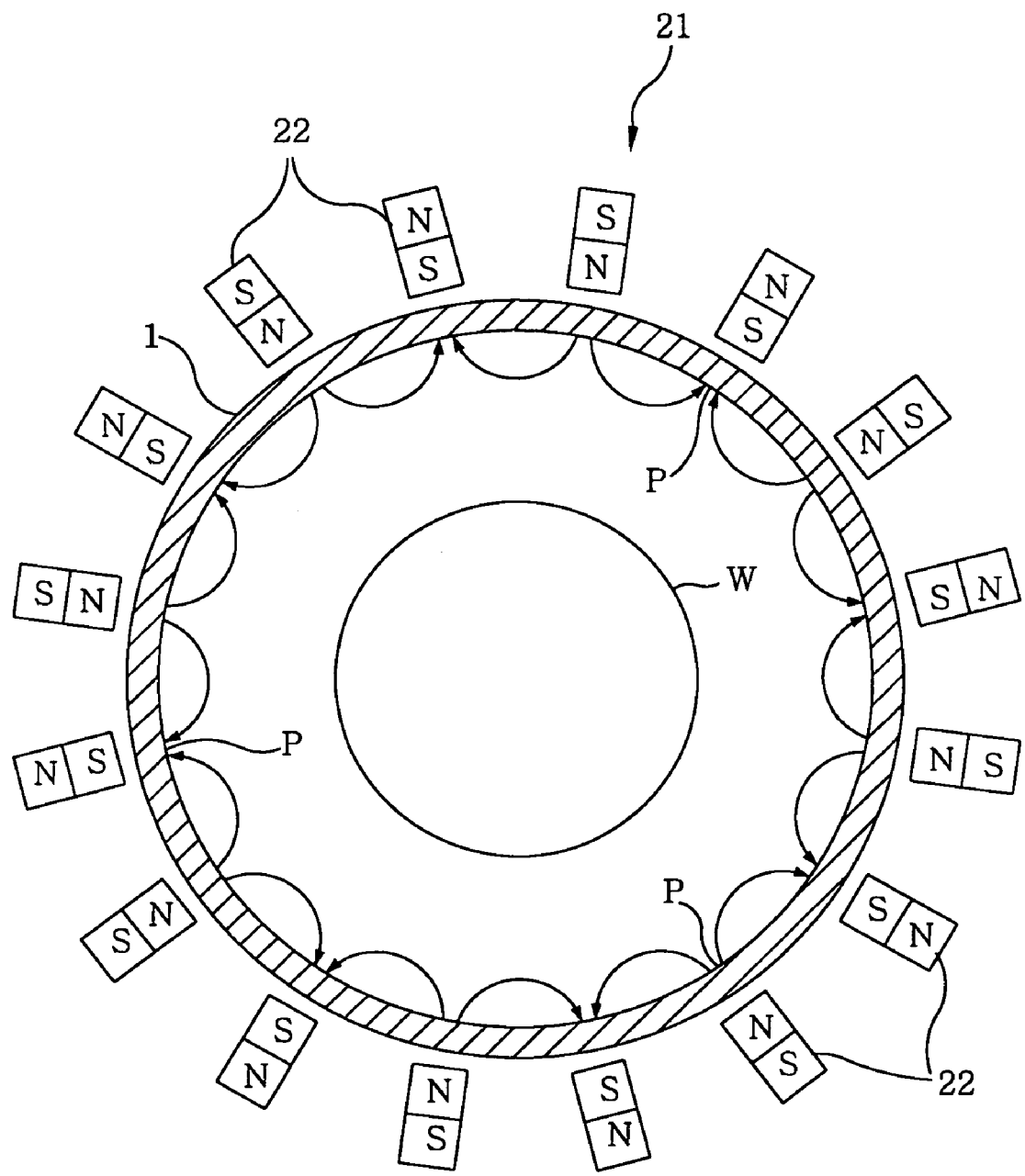
FIG. 2 shows a schematic diagram of a magnetic field forming mechanism of the plasma processing device offered in FIG. 1.

As illustrated in FIG. 2, the magnetic field forming mechanism 21 includes a plurality of magnet segments 22 (sixteen magnet segments in FIG. 2) made of permanent magnets supported by a supporting member (not shown). In the state shown in FIG. 2, the magnet segments 22 have respective magnetic poles facing the vacuum chamber 1, which are alternately disposed in a N, S, N, S, N, ... fashion.

In other words, in the magnetic field forming mechanism 21 shown in FIG. 2, the magnetic pole directions of neighboring magnet segments 22 are opposite to each other. Therefore, as shown by the magnetic lines of force, a multi-pole magnetic field is formed between the neighboring magnet segments 22 in such a manner that the magnetic field strength ranges from, e.g., 0.02 to 0.2 T (from 200 to 2000 G), preferably from 0.03 to 0.045 T (from 300 to 450 G) around the processing space, i.e., in the vicinity of an inner wall of the vacuum chamber 1 and substantially no magnetic field exists near the center region of the semiconductor wafer W.

When the magnetic field strength is excessively high a leakage of the the magnetic field occurs, whereas an excessively low magnetic field prevents effects of a blockage of the plasma, and hence it is necessary to establish a range for the magnetic field strength as prescribed above. However, the above-specified range of the magnetic field strength serves only as an example which can be varied according to the structure (material) of the apparatus and, accordingly, the magnetic field strength is not limited thereto.

Furthermore, though it is preferable that the substantially no magnetic field near the center region of the semiconductor wafer W corresponds to the magnetic field strength of 0 T, it may be acceptable that there exists a magnetic field which does not affect the etching process at a region where the semiconductor wafer W is disposed and a magnetic field strength has a practically negligible effect on the semiconductor wafer W. Under the configuration shown in FIG. 2, a magnetic field having a magnetic flux density of no more than, e.g., 420 μT (4.2 G), is applied around the semiconductor wafer, thereby serving to trap the plasma.

Figure 3A:
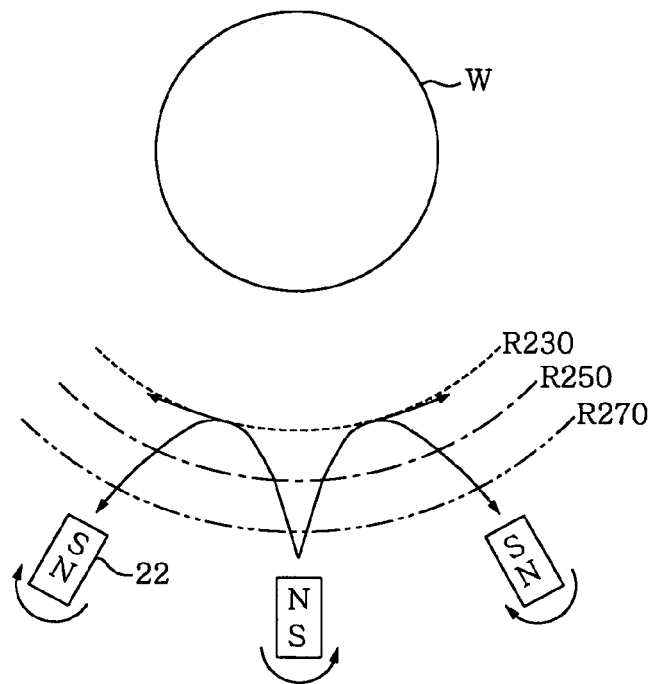
FIGS. 3A to 3C explain rotation of magnet segments of the plasma processing device shown in FIG. 1.
Figure 3B:
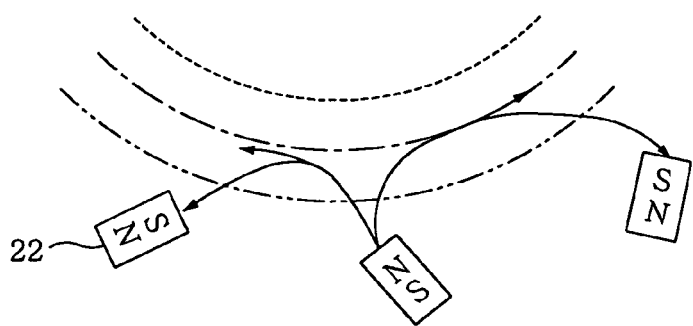
Figure 3C:
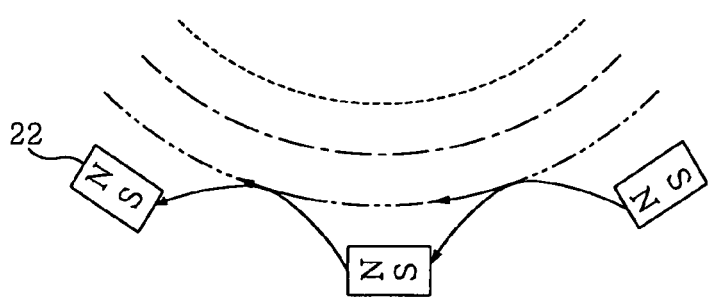

Furthermore, in the preferred embodiment, each of the magnet segments 22 of the magnetic field forming mechanism 21 can be rotated about its vertical axis inside the magnetic field forming mechanism 21, by the magnet segment rotation unit not shown in the drawing. In other words, from a state in which a pole of each of the magnet segments 22 faces the vacuum chamber 1 as illustrated in FIGS. 2 and 3A, the every two neighboring magnet segments 22 are synchronously rotated in opposite directions, that is, every other magnet segment 22 is rotated in a same direction, thereby arriving at a state as shown in FIGS. 3B and 3C. FIGS. 3B and 3C show the magnet segments 22 rotated 45-degrees and 90-degrees, respectively.

Figure 4:
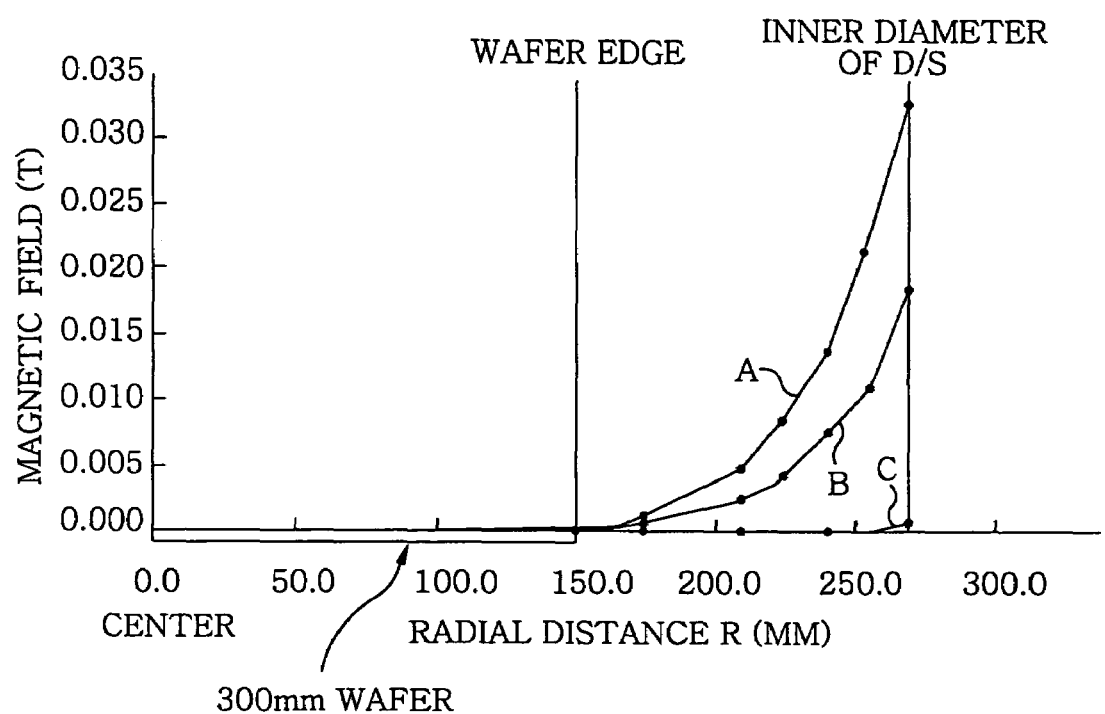
FIG. 4 sets forth states of a magnetic field strength of the plasma processing device.

In a graph of FIG. 4, the x-axis represents a distance from the center of the semiconductor wafer W disposed in the vacuum chamber 1; and the y-axis represents the magnetic field strength. The graph of FIG. 4 shows a relationship between the distance from the center of the semiconductor wafer W and the magnetic field strength, when the respective magnetic poles of the magnet segments 22 face toward the vacuum chamber 1, as shown in FIG. 3A (Curve A); the magnet segments 22 are rotated 45-degrees, as shown in FIG. 3B (Curve B); and the magnet segments 22 are rotated 90-degrees, as in FIG. 3C (Curve C). Further, "inner diameter of D/S" in the drawing denotes an inner diameter of an inner wall protection member (a deposition shield) installed on an inner wall of the vacuum chamber 1 and actually represents an inner diameter of the vacuum chamber 1 (the processing chamber).

As represented by Curve A in a same drawing, in case the magnetic pole of each magnet segment 22 faces to the vacuum chamber 1, the multi-pole magnetic field is formed even to the periphery of the semiconductor wafer W. Further, as represented by Curve C, in case the magnet segments 22 are rotated 90-degrees, there are practically no magnetic field formed in the vacuum chamber 1, (that is, the magnetic field strength is about 0). In case the magnet segments 22 are rotated 45-degrees, there prevails an intermediate state of the above two cases, as shown in Curve B.

In the preferred embodiment as described above, every two neighboring magnet segments 22 constituting the magnetic field forming mechanism 21 is configured to be synchronously rotated in two opposite directions. By such rotation of the magnet segments 22, it is possible to set the vacuum chamber 1 in states in which substantial multi-pole magnetic field is formed around the semiconductor wafer W disposed therein and the multi-pole magnetic field is practically absent around the semiconductor wafer W.

Accordingly, for example, in case of etching the aforementioned silicon oxide film or the like, the etching is performed with the multi-pole magnetic field formed around the semiconductor wafer W in the vacuum chamber 1, thereby improve the in-surface uniformity of the etching rate for the semiconductor wafer W. On the other hand, in case of etching the organic-based low dielectric film (Low-K) or the like, the etching is performed without the multi-pole magnetic field formed around the semiconductor wafer W in the vacuum chamber 1, thereby improving the in-surface uniformity of the etching rate for the semiconductor wafer W.

Figure 5:
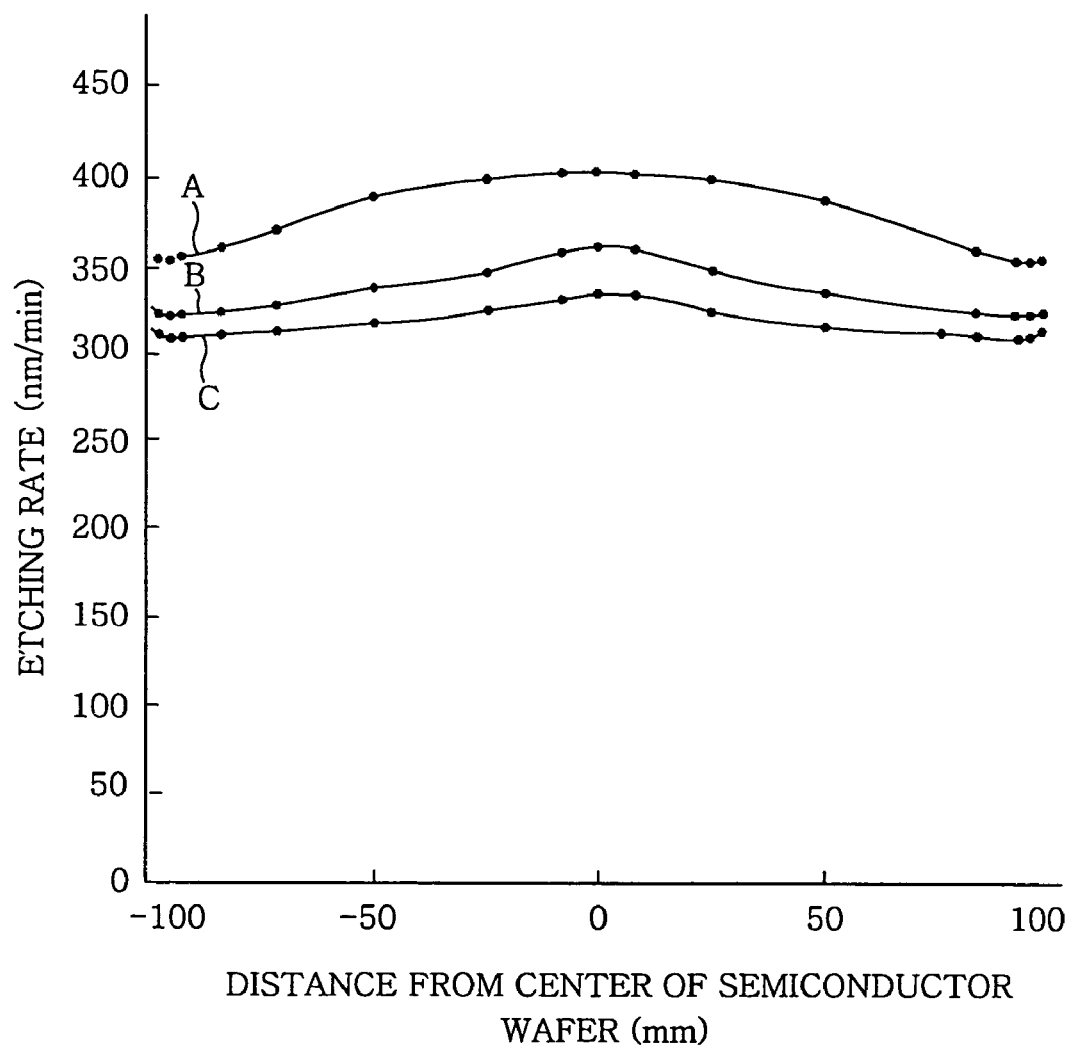
FIG. 5 presents a graph showing a relationship between an in-surface distribution of an etching rate and a magnetic field strength.
Figure 6:
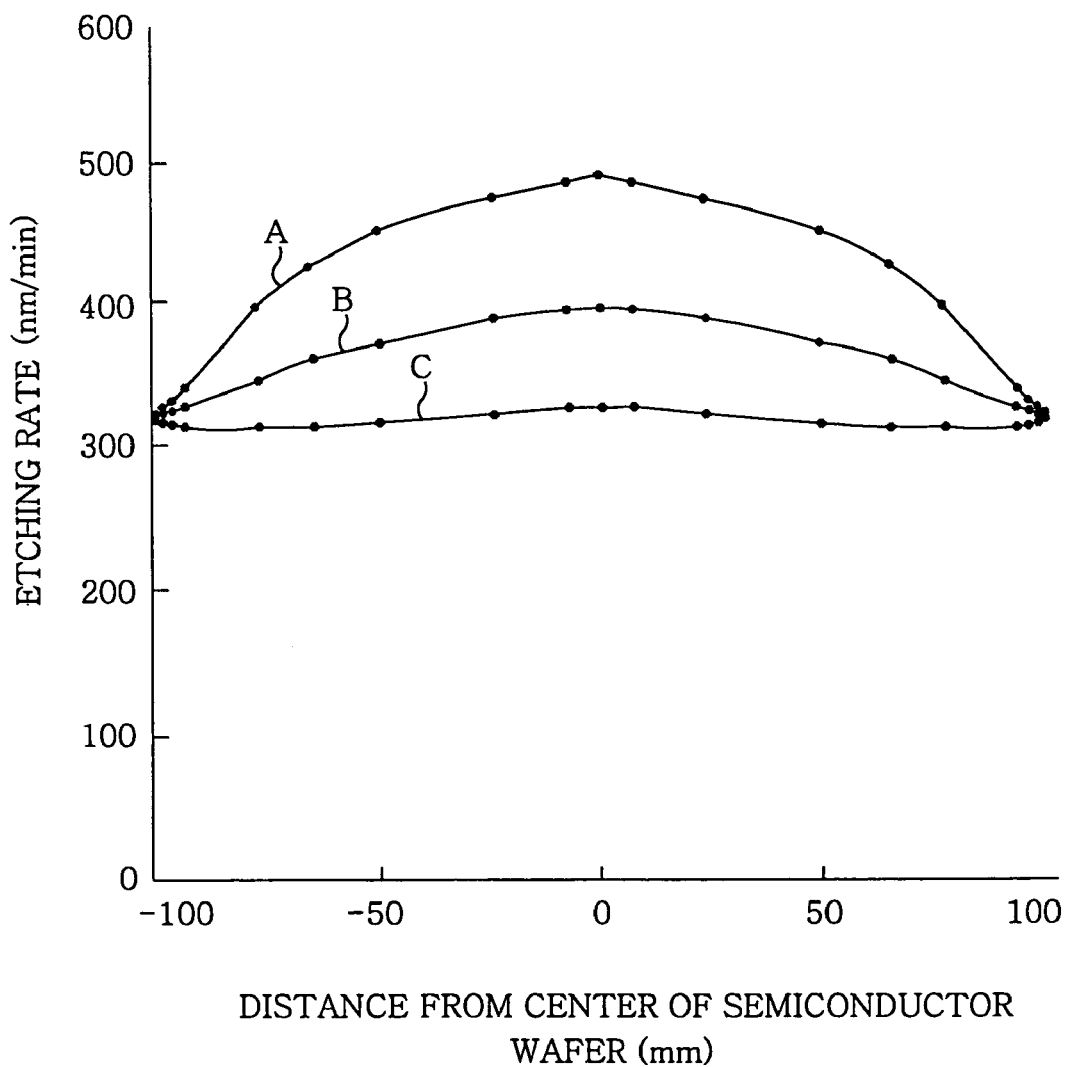
FIG. 6 provides a graph illustrating a relationship between an in-surface distribution of an etching rate and a magnetic field strength.
Figure 7:
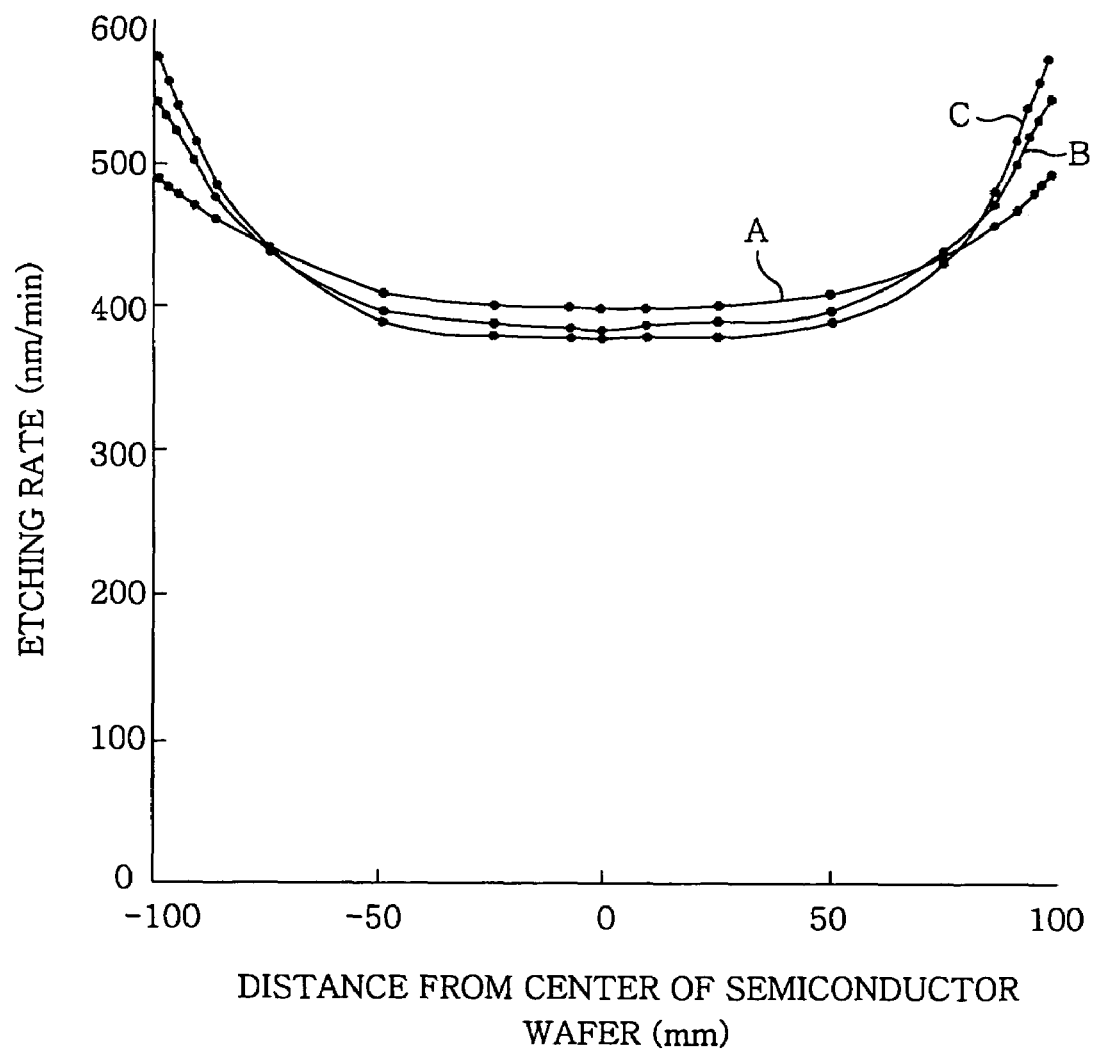
FIG. 7 describes a graph illustrating a relationship between an in-surface distribution of an etching rate and a magnetic field strength.

FIGS. 5 to 7 illustrate results from inspecting the in-surface uniformity of the etching rate of the semiconductor wafer W, wherein the x-axis and y-axis denote the distance from the center point of the semiconductor wafer W and the etching rate (etching velocity), respectively. In each drawing, Curves A, B and C represent the in-surface uniformity of the etching rate in cases of not forming the multi-pole magnetic field in the vacuum chamber 1; forming the multi-pole magnetic field having the magnet field strength of 0.03 T (300 G); and forming the multi-pole magnetic field having the magnet field strength of 0.08 T (800 G), respectively.

Furthermore, FIG. 5 shows the result of etching the silicon oxide film by employing a $C_4F_8$ gas; FIG. 6 shows the result of etching the silicon oxide film by employing a $CF_4$ gas; and FIG. 7 shows the result of etching the organic-based low dielectric film (Low-k) by a gaseous mixture including $N_2$ and $H_2$.

As depicted in FIGS. 5 and 6, in case the silicon oxide film is etched by using the gas including C or F such as the $C_4F_8$ gas or the $CF_4$ gas, a higher in-surface uniformity of the etching rate can be obtained by performing the etching process in the presence of the multi-pole magnetic field formed in the vacuum chamber 1.

Further, as illustrated in FIG. 7, in case the organic-based low dielectric film (Low-K) is etched by using the gaseous mixture of $N_2$ and $H_2$, a higher in-surface uniformity of the etching rate can be obtained by performing the etching process in the absence of the multi-pole magnetic field formed in the vacuum chamber 1.

In the preferred embodiment as explained above, the state of the multi-pole magnetic field in the vacuum chamber 1 can be controlled easily by rotating the magnet segments 22, thereby performing a proper process of the semiconductor wafer W in the optimum state of the multi-pole magnetic field corresponding to the kinds of the processes to be performed.

Figure 8:
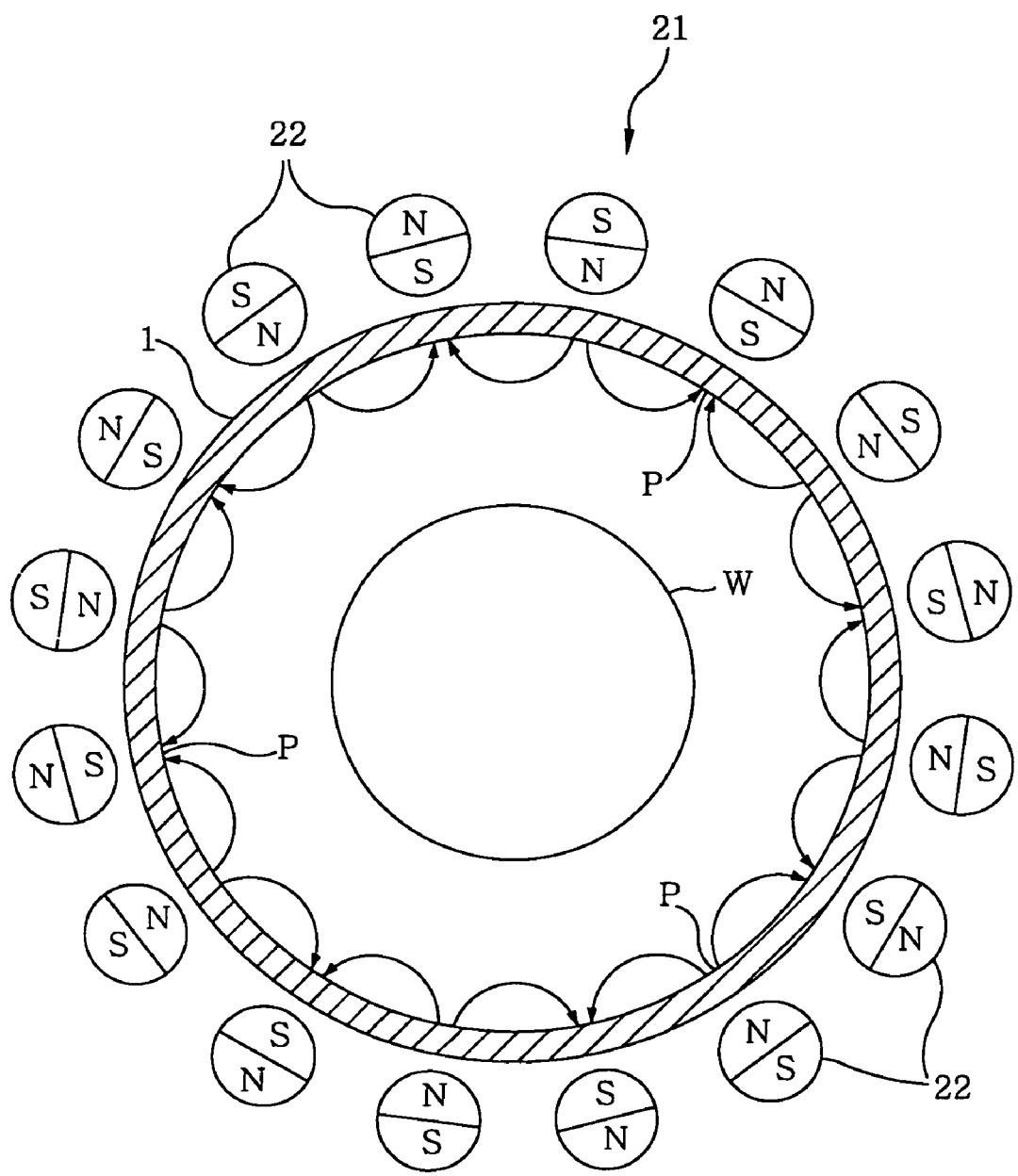
FIG. 8 depicts a configuration of a modified example of the magnet segments.

Further, the number of the magnet segments 22 is not limited to sixteen as illustrated in FIG. 2. Also, the cross sectional shape of the magnet segment 22 is not limited to a rectangular shape shown in FIG. 2 and it may be a circular or a square shape. It is preferable to employ cylindrical magnet segments each having a circular cross section as depicted in FIG. 8 so that the installation space of the rotating magnet segments 22 can be used efficiently and the size of the apparatus can be scaled down. Further, a material of the magnet segments is not limited to any particular one, and known magnetic materials, e.g., rare earth magnet, ferrite magnet, Alnico magnet or the like can be used therefor.

Figure 9:
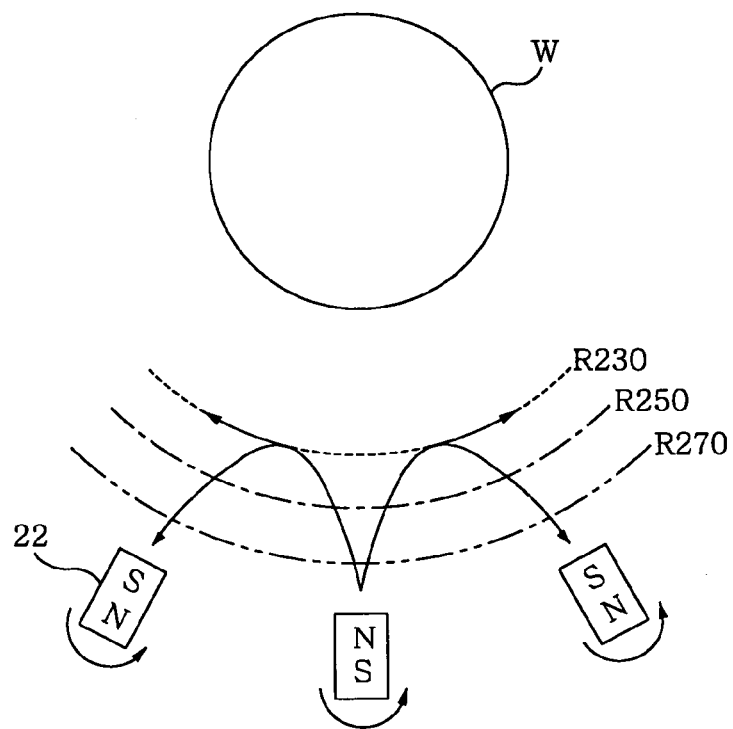
FIG. 9 describes a modified example of the rotation of the magnet segments.

In the above-described preferred embodiment, every two neighboring magnet segments 22 are configured to be synchronously rotated in two opposite directions, but the rotating directions are not limited thereto. For example, all the magnet segments 22 may be rotated in the same direction as shown in FIG. 9.

Figure 10:
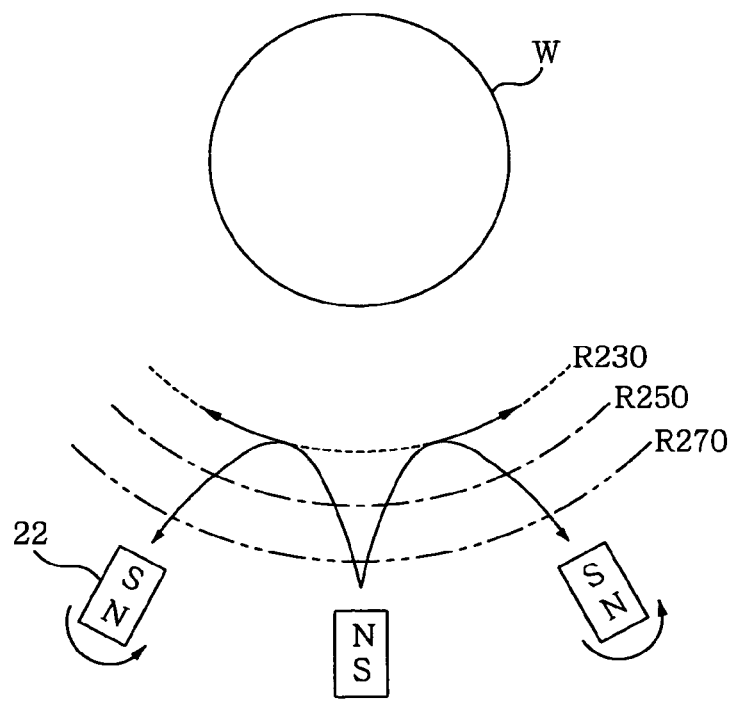
FIG. 10 offers another modified example of the rotation of the magnet segments.

Further, as illustrated by the arrows in FIG. 10, the magnet segments 22 can be configured in a manner that every other magnet segment 22 is rotated and the rest of the magnet segments are fixed, thereby reducing the number of magnet segments 22 being rotated and, therefore, simplifying the configuration of the rotation unit.

Figure 11:
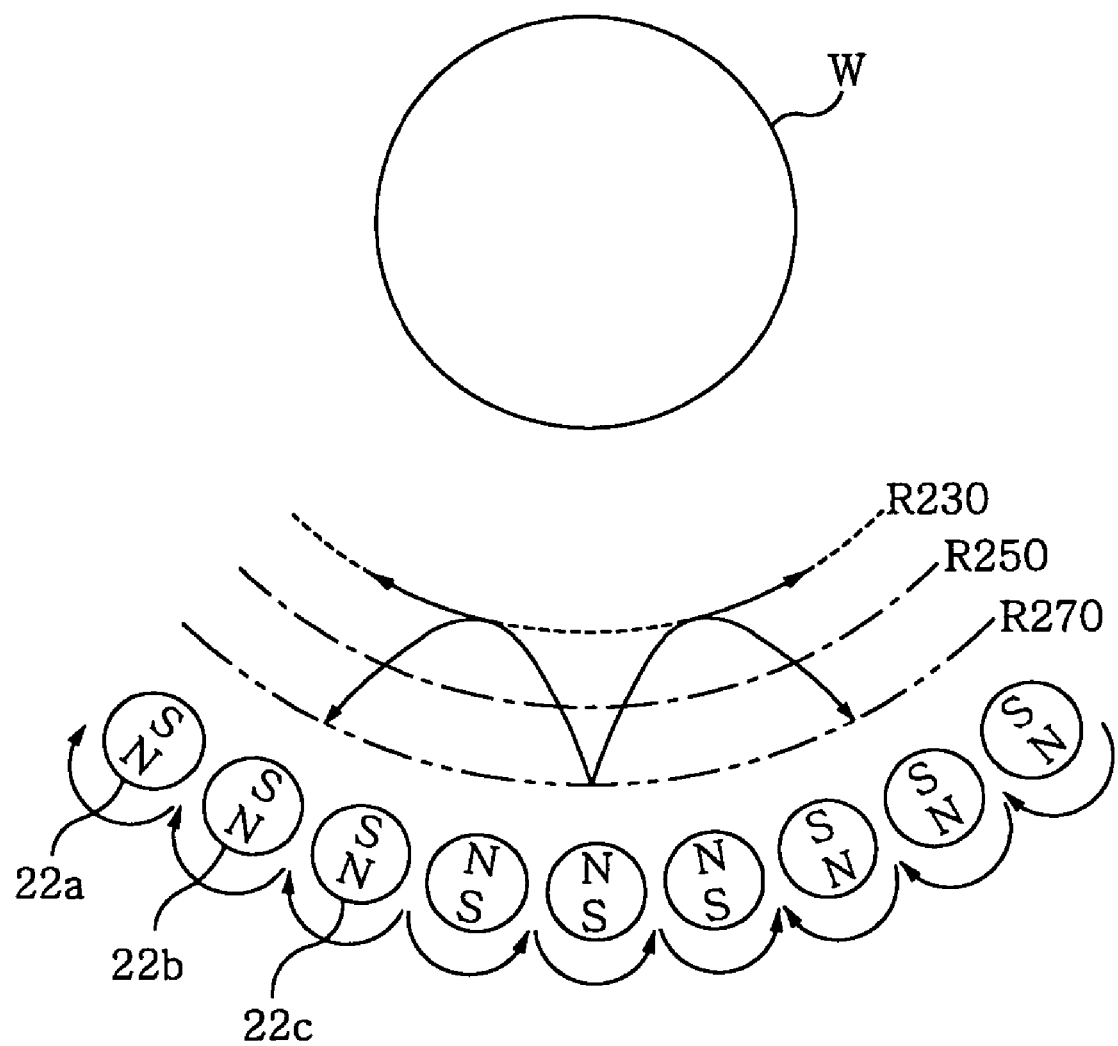
FIG. 11 shows a configuration of another modified example of the magnet segments.

Moreover, as shown in FIG. 11, a magnet segment set serving as single magnetic pole may be configured to include a plural number of magnet segments, e.g., three magnet segments 22a, 22b, 22c, which are synchronously rotated in a same direction. By employing the magnet segment set as described above, the magnetic field strength can be raised.

Next, a processing procedure of a plasma processing device configured as described above will be described.

First, the gate valve 24 is opened, and the semiconductor wafer W is carried into the vacuum chamber 1 therethrough via a load-lock chamber (not shown) disposed adjacent to the gate valve 24 by employing a conveying mechanism (not shown). Then the wafer W is mounted on the supporting table 2 disposed at a lowered position prior to mounting. Thereafter, a predetermined voltage is applied to the electrode 6a of the electrostatic chuck 6 from the DC power supply 13 and the semiconductor wafer W is adsorbed by the Coulomb force.

Then, the conveying mechanism is withdrawn from the vacuum chamber 1 and the gate valve 24 is closed. Next, the supporting table 2 is raised to a position shown in FIG. 1 while the vacuum chamber 1 is evacuated via the gas outlet port 19 by the vacuum pump of the gas pumping system 20.

After the vacuum chamber 1 is evacuated to a predetermined vacuum level, a process gas of a flow rate ranging from, e.g., 100 to 1000 sccm is introduced thereinto from the process gas supply system 15 and the inside of the vacuum chamber 1 is maintained at a predetermined pressure ranging from, e.g., about 1.33 to 133 Pa (from 10 to 1000 mTorr), preferably, from about 2.67 to 26.7 Pa (from 20 to 200 mTorr). A high frequency power ranging from 100 to 3000 W with a frequency of, e.g., 100 MHz is applied to the supporting table 2 from the high frequency power supply 10. The frequency of the high frequency power may range from 13.56 to 150 MHz. In this case, by applying the high frequency power to the supporting table 2 serving as the lower electrode, a high frequency electric field is formed between the shower head 16 functioning as the upper electrode and the supporting table 2 functioning as the lower electrode. The high frequency electric field serves to convert the process gas supplied to the processing space into a plasma by which a predetermined film on the semiconductor wafer W is etched.

At this time, depending on the type of process to be performed, it is necessary to preset the directions of the magnet segments 22 to control the multi-pole magnetic field to be in a state where there exists a multi-pole magnetic field of a predetermined strength in the vacuum chamber 1 or in a state where practically there exists no multi-pole magnetic field in the vacuum chamber 1, as described above.

Furthermore, in case the multi-pole magnetic field is formed, parts of the sidewall portions (the deposition shield) of the vacuum chamber 1, e.g., parts indicated by P in FIG. 2, corresponding to the magnetic poles may be eroded by the plasma, which may become problematic. In order to avoid such a problem, the magnetic field forming mechanism 21 is rotated around the vacuum chamber 1 by the rotation unit 25 having a driving source such as a motor. Since the magnetic poles are moved against the wall portions of the vacuum chamber 1 by the rotation of the magnetic field forming mechanism 21, the wall portions are prevented from being locally eroded.

Upon completion of the etching process, the high frequency power supply 10 stops supplying the high frequency power and the etching process is stopped. Then, the semiconductor wafer W is carried out from the vacuum chamber 1 in a reverse order of the loading sequence.

The preferred embodiment describes the multi-pole magnetic field controlled by rotating at least parts of the magnet segments 22 on the respective vertical axes thereof on a horizontal plane. Hereinafter, a multi-pole magnetic field controlling mechanism in accordance with another preferred embodiment of the present invention will be described. In a manner similar to the preferred embodiment of the above, the multi-pole magnetic field is controlled by changing the relative positions (including rotating positions) of the magnet segments 22.

Figure 12A:
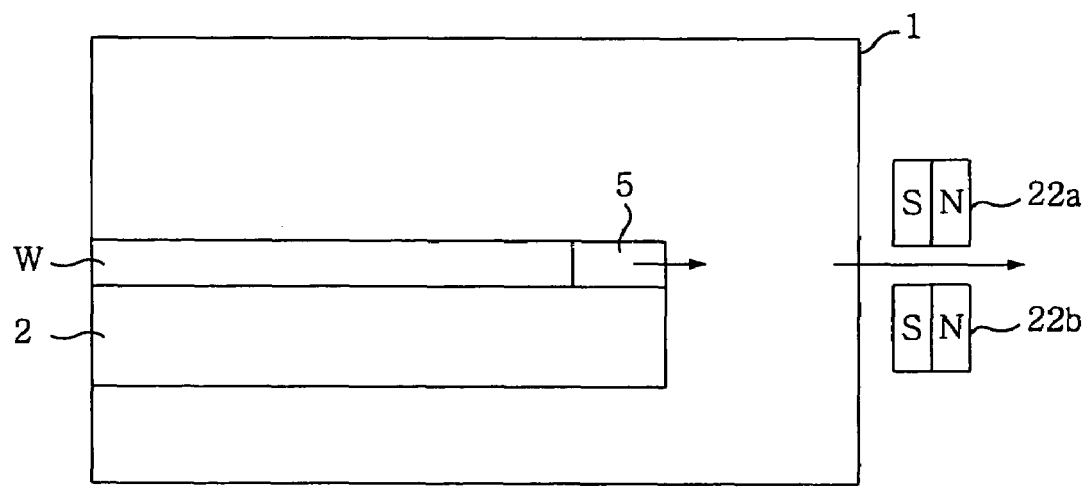
FIGS. 12A and 12B illustrate a configuration of a modified example of a magnetic field controlling mechanism.
Figure 12B:
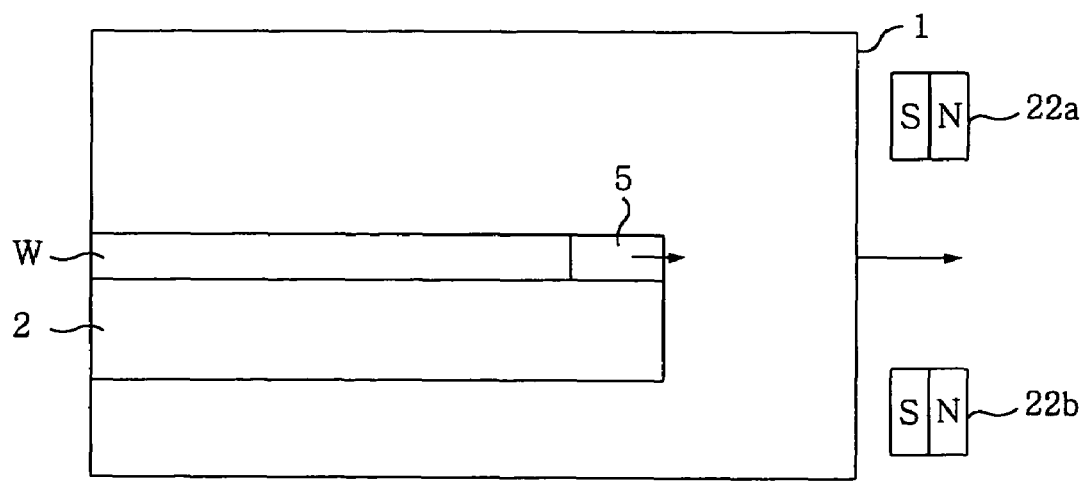

In an example illustrated in FIGS. 12A and 12B, a ring-shaped magnetic field forming mechanism is configured to be divided into an upper and a lower magnetic field forming mechanisms installed separately at upper and lower positions; and the magnet segments 22a and 22b respectively installed at the upper and the lower magnetic field forming mechanism can be moved vertically as to move close to and apart from each other.

In the magnetic field forming mechanism configured as described above, in case the magnet segments 22a and 22b come close to each other, the magnetic field strength increases as represented by an arrow in FIG. 12A, whereas, in case the magnet segments 22a and 22b are spaced apart from each other, the magnetic field strength decreases as represented by an arrow in FIG. 12B.

Figure 13A:
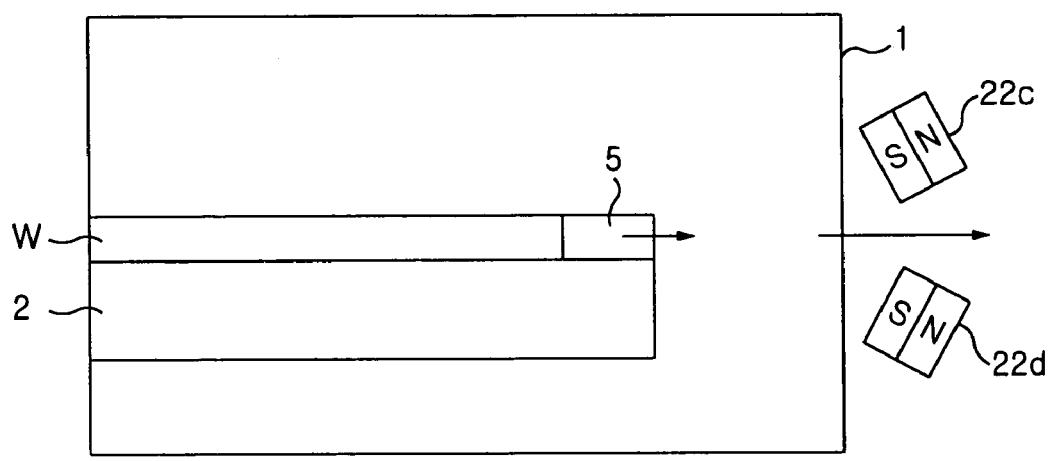
FIGS. 13A and 13B present a configuration of another modified example of the magnetic field controlling mechanism.
Figure 13B:
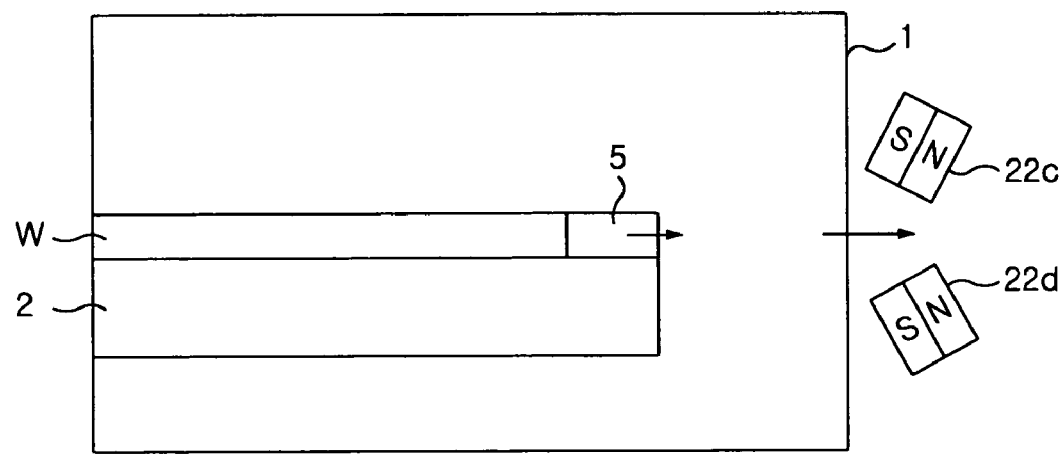

In an example as illustrated in FIGS. 13A and 13B, another ring-shaped magnetic field forming mechanism is configured to be divided into an upper and a lower magnetic field forming mechanism installed separately at upper and lower positions; and the magnet segments 22c and 22d respectively installed to the upper and the lower magnetic field forming mechanism are configured to be synchronously rotated in two opposite directions to each other about horizontal axes thereof on perpendicular planes.

In the magnetic field forming mechanism configured as described above, in case the magnet segments 22d are rotated to be inwardly tilted, the magnetic field strength increases as expressed by an arrow in FIG. 13A. Further, in case the magnet segments 22c and 22d are rotated to be outwardly tilted, the magnetic field strength decreases as expressed by an arrow in FIG. 13B.

Figure 14A:
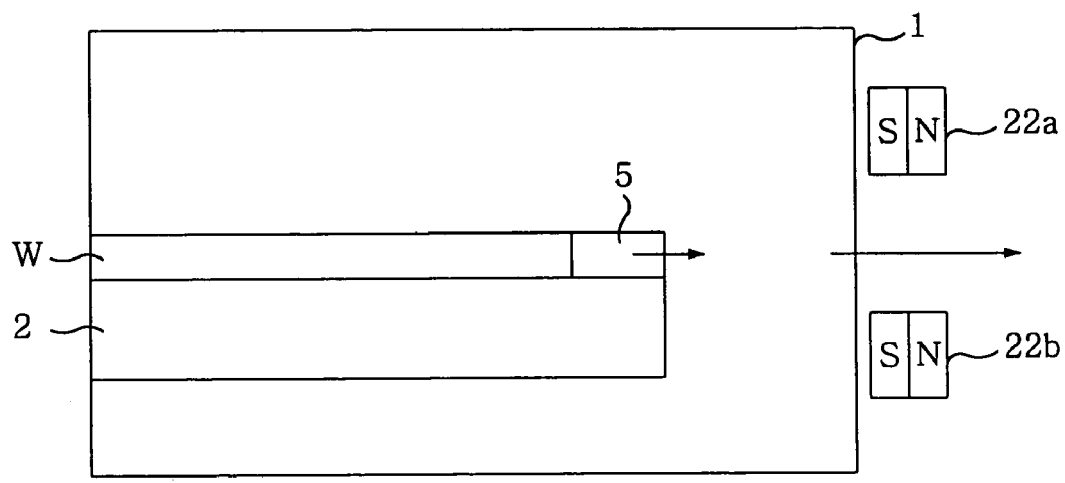
FIGS. 14A and 14B provide a configuration of still another modified example of the magnetic field controlling mechanism.
Figure 14B:
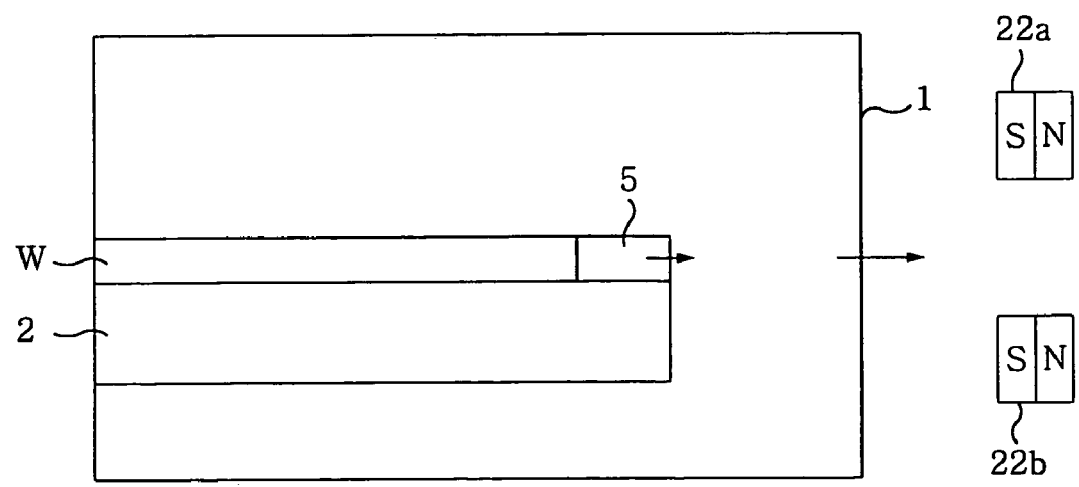

In still another example shown in FIGS. 14A and 14B, a ring-shaped magnetic field forming mechanism is configured to be divided into an upper and a lower magnetic field forming mechanism installed seperated at upper and lower positions. The magnet segments 22a and 22b installed respectively to the upper and the lower magnetic field forming mechanism are configured to synchronously move in horizontal directions diametrically away from each other and come closer to each other toward the center thereof.

In the magnetic field forming mechanism with such a configuration, the magnetic field strength is increased as illustrated by an arrow in FIG. 14A in case of moving the magnet segments 22a and 22b toward the vacuum chamber 1, i.e., to reduce the diameter of the ring. Contrarily, in case moving the magnet segments 22a and 22b away from the vacuum chamber 1, i.e., to increase the diameter of the ring, the magnetic field strength is decreased as illustrated by an arrow in FIG. 14B.

The multi-pole magnetic field in the vacuum chamber 1 may be controlled by the configuration described above. Under such configurations, it is preferable that the ring-shaped magnetic field forming mechanism 21 is configured so as to be rotated as a single body around the vacuum chamber 1 at a predetermined rotating speed by the rotation unit 25 shown in FIG. 1. The present invention is applied to the etching device for etching the semiconductor wafer in the preferred embodiments, but is not limited thereto. For example, the present invention can be applied to processing a substrate other than the semiconductor wafer and also can be applied to other apparatus performing a plasma processing other than etching, e.g., a film formation processing apparatus such as CVD apparatus or the like.

As described above, in accordance with the present invention, the state of the multi-pole magnetic field can be easily set and controlled depending on the type of a process to be performed, thereby enabling an adequate processing.

INDUSTRIAL APPLICABILITY

The plasma processing device in accordance with the present invention can be used in the semiconductor manufacturing industry, for manufacturing semiconductor devices. Accordingly, the present invention has an industrial applicability.

What is claimed is:

1. A plasma processing device comprising:
a processing chamber accommodating therein a substrate to be processed;
a plasma generating mechanism installed in the processing chamber for performing a plasma process on the substrate to be processed; and
a magnetic field forming mechanism for forming a multi-pole magnetic field around a periphery of the substrate to be processed accommodated in the processing chamber, the magnetic field forming mechanism including a plurality of magnet segments made of permanent magnets and a magnet segment rotation unit, and being installed outside the processing chamber,
wherein the magnet segment rotation unit rotates at least parts of the magnet segments about respective vertical axes of said at least part of the magnet segments to thereby change an angle between magnetic pole directions of every two neighboring magnet segments to adjust strength of the multi-pole magnetic field formed around the substrate to be processed in the processing chamber according to a type of a to-be-etched layer formed on a surface of the substrate to be processed, and the magnet segment rotation unit rotates said every two neighboring magnet segments in opposite directions.

2. The plasma processing device of claim 1, wherein the magnet segment rotation unit rotates said every two neighboring magnet segments by an identical angle.

3. The plasma processing device of claim 1, wherein the magnet segments are arranged on one horizontal plane parallel to a surface of the substrate such that magnetic pole directions of the magnet segments lie on said one horizontal plane.

4. The plasma processing device of claim 1, wherein, in every three consecutively arranged magnet segments including a first one, a second one and a third one disposed therebetween, the sum of a first angle and a second angle is 360°, the first angle being an angle of a magnetic pole direction of the first magnet segment with respect to a magnetic pole direction of the third magnet segment and the second angle being an angle of a magnetic pole direction of the second magnet segment with respect to the magnetic pole direction of the third magnet segment.

5. A plasma processing device comprising:
a processing chamber accommodating therein a substrate to be processed;
a plasma generating mechanism installed in the processing chamber for performing a plasma process on the substrate; and
a magnetic field forming mechanism for forming a multi-pole magnetic field around a periphery of the substrate accommodated in the processing chamber, the magnetic field forming mechanism including a plurality of magnet segments made of permanent magnets and being installed outside the processing chamber,
wherein the magnetic field forming mechanism rotates at least parts of the magnet segments about respective vertical axes of said at least parts of the magnet segments to thereby change an angle between magnetic pole directions of every two neighboring magnet segments to adjust strength of the multi-pole magnetic field formed around the periphery of the substrate according to a type of a to-be-etched layer formed on a surface of the substrate, and the magnetic field forming mechanism rotates every two neighboring magnet segments in opposite directions.

6. The plasma processing device of claim 5, wherein the magnetic field forming mechanism rotates said every two neighboring magnet segments by an identical angle.

7. The plasma processing device of claim 5, wherein the magnet segments are arranged on one horizontal plane parallel to a surface of the substrate such that magnetic pole directions of the magnet segments lie on said one horizontal plane.

8. The plasma processing device of claim 5, wherein, in every three consecutively arranged magnet segments including a first one, a second one and a third one disposed therebetween, the sum of a first angle and a second angle is 360°, the first angle being an angle of a magnetic pole direction of the first magnet segment with respect to a magnetic pole direction of the third magnet segment and the second angle being an angle of a magnetic pole direction of the second magnet segment with respect to the magnetic pole direction of the third magnet segment.

9. A plasma processing device comprising:
a processing chamber accommodating therein a substrate to be processed;
a plasma generating mechanism installed in the processing chamber for performing a plasma process on the substrate; and
a magnetic field forming mechanism for forming a multi-pole magnetic field around a periphery of the substrate, the magnetic field forming mechanism including a plurality of magnet segments made of permanent magnets and being installed outside of the processing chamber,
wherein the magnetic field forming mechanism rotates every two neighboring magnet segments about respective vertical axes of said every two neighboring magnet segments in opposite directions to adjust strength of the multi-pole magnetic field formed around the periphery of the substrate according to a type of a to-be-etched layer formed on a surface of the substrate.

10. The plasma processing device of claim 9, wherein the magnetic field forming mechanism rotates said every two neighboring magnet segments by an identical angle.

11. The plasma processing device of claim 9, wherein the magnet segments are arranged on one horizontal plane parallel to a surface of the substrate such that magnetic pole directions of the magnet segments lie on said one horizontal plane.

12. The plasma processing device of claim 9, wherein, in every three consecutively arranged magnet segments including a first one, a second one and a third one disposed therebetween, the sum of a first angle and a second angle is 360°, the first angle being an angle of a magnetic pole direction of the first magnet segment with respect to a magnetic pole direction of the third magnet segment and the second angle being an angle of a magnetic pole direction of the second magnet segment with respect to the magnetic pole direction of the third magnet segment.

* * * * *